(12) United States Patent
Kamarehi et al.

(10) Patent No.: US 9,831,066 B1
(45) Date of Patent: Nov. 28, 2017

(54) COMPACT MICROWAVE PLASMA APPLICATOR UTILIZING CONJOINING ELECTRIC FIELDS

(71) Applicant: MKS Instruments, Inc., Andover, MA (US)

(72) Inventors: Mohammad Kamarehi, Lexington, MA (US); Chaolin Hu, North Billerica, MA (US); Olivia Keller, Topsfield, MA (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 15/166,777

(22) Filed: May 27, 2016

(51) Int. Cl.
*H01J 37/32* (2006.01)

(52) U.S. Cl.
CPC .. *H01J 37/32229* (2013.01); *H01J 37/32467* (2013.01)

(58) Field of Classification Search
None
See application file for complete search history.

(56) References Cited

U.S. PATENT DOCUMENTS

| | | | |
|---|---|---|---|
| 5,049,843 A * | 9/1991 | Barnes | H01J 37/32192 315/39 |
| 5,179,264 A * | 1/1993 | Cuomo | H01J 37/32201 219/121.36 |
| 5,498,308 A | 3/1996 | Kamarehi et al. | |
| 5,961,851 A | 10/1999 | Kamarehi et al. | |
| 6,263,830 B1 | 7/2001 | Kamarehi et al. | |
| 6,439,155 B1 | 8/2002 | Kamarehi et al. | |
| 7,183,514 B2 | 2/2007 | Kamarehi | |
| 7,497,922 B2 | 3/2009 | Kumar et al. | |
| 7,554,053 B2 | 6/2009 | Kamarehi et al. | |
| 7,562,638 B2 | 7/2009 | Kamarehi et al. | |

(Continued)

FOREIGN PATENT DOCUMENTS

EP 1102521 5/2001

OTHER PUBLICATIONS

International Search Report and Written Opinion from corresponding PCT Application No. PCT/US2017/031275, International Filing Date May 5, 2017, dated Aug. 9, 2017.

*Primary Examiner* — Douglas W Owens
*Assistant Examiner* — James H Cho
(74) *Attorney, Agent, or Firm* — Burns & Levinson, LLP; Joseph M. Maraia; Steven M. Mills

(57) ABSTRACT

A plasma applicator includes a plasma discharge tube and a microwave cavity at least partially surrounding a portion of the plasma discharge tube. Microwave energy is coupled to the microwave cavity via a coupling iris. At least two orthogonal dimensions of the microwave cavity are selected such that the microwave energy in the microwave cavity propagates in a transverse electric (TE) mode. Primary electric fields generated from the microwave energy combine with an evanescent electric field generated from the coupling iris, such that a combined electric field in the microwave cavity is substantially uniform along the longitudinal axis of the plasma discharge tube. A plurality of radial microwave chokes is disposed over an exterior of the plasma discharge tube. Positions of the microwave chokes are such that microwave energy propagating in the TE mode and a transverse electric magnetic (TEM) mode is attenuated.

22 Claims, 16 Drawing Sheets

(56) References Cited

U.S. PATENT DOCUMENTS

| | | | |
|---|---|---|---|
| 8,048,329 B2 | 11/2011 | Kamarehi et al. | |
| 9,345,121 B2 | 5/2016 | Vahidpour et al. | |
| 2002/0112819 A1 | 8/2002 | Kamarehi et al. | |
| 2004/0182834 A1 | 9/2004 | Kamarehi | |
| 2011/0117202 A1* | 5/2011 | Bourke, Jr. | H05B 41/2806 424/490 |
| 2014/0290860 A1 | 10/2014 | Iwasaki | |
| 2015/0318148 A1* | 11/2015 | Chen | H01J 37/32229 315/39 |

* cited by examiner

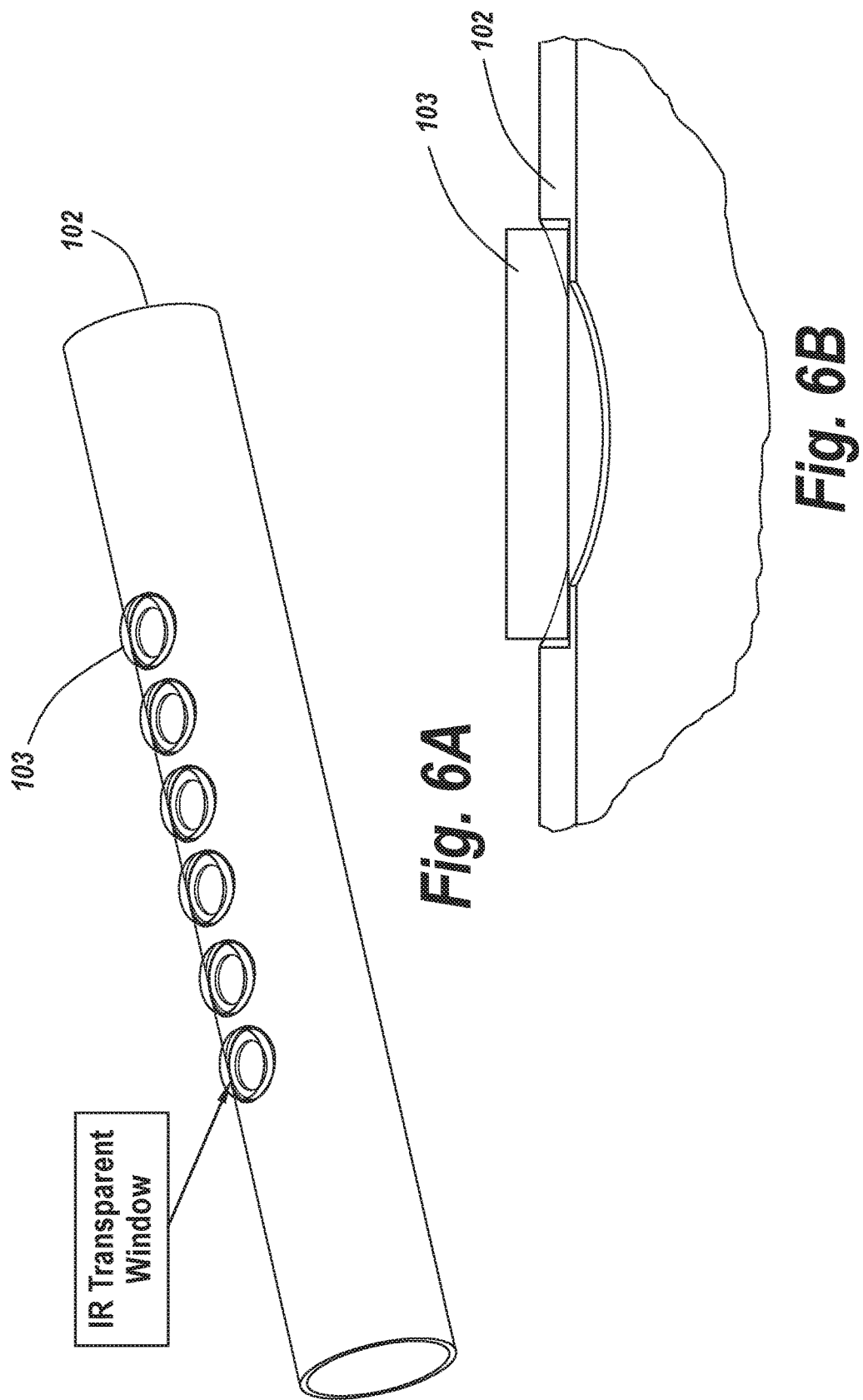

COMPACT MICROWAVE PLASMA APPLICATOR UTILIZING CONJOINING ELECTRIC FIELDS

BACKGROUND

1. Technical Field

The present disclosure is related to plasma applicators and, in particular, to a compact microwave plasma applicator which utilizes conjoining electric fields.

2. Discussion of Related Art

In semiconductor processing, plasma generators are often employed upstream of a processing chamber. In plasma generators, energy is typically coupled to a gas flowing through a plasma discharge tube which is located in a microwave cavity, and plasma is excited in the gas by the microwave energy. Plasma products flow downstream through the plasma discharge tube, into the process chamber, and impinge on a workpiece such as a semiconductor wafer.

In plasma generation systems, energy efficiency and cost are important considerations. In conventional high-energy, e.g., greater than 5 kW microwave power, plasma generators, the plasma discharge tube can reach extremely high temperatures. To reduce the effects of the high temperatures, cooling systems are typically employed. Generally, liquid coolants, e.g., water, are circulated through a copper winding/coil around the tube to remove excess heat. These liquid cooling systems tend to be very expensive, but are unavoidable because of the high temperatures at the high power levels. It is preferable to use air cooling in plasma generators because of its reduced complexity and cost, but air cooling is typically only useful in systems using lower power, e.g., 1 kW or less microwave power, because air cooling is effective against the relatively lower temperatures generated in the plasma discharge tube.

Also, because of non-uniform excitation energy patterns, e.g., electric fields, used to excite the gases to generate plasma in the plasma discharge tube, plasma can be generated in a non-uniform spatial pattern, resulting in "hot spots" at which the plasma energy and, therefore, temperature, in the tube is especially high. These "hot spots" induce inefficiency in the plasma generation process. Also, they present a non-uniform temperature control burden to the cooling system, whether air cooling or water cooling is used. For this and other reasons, it is highly desirable that the microwave energy, and, in particular, the electric fields, used to generate plasma in the plasma discharge tube be spatially uniform, so that the resulting plasma is relatively free of hot spots.

SUMMARY

According to a first aspect, a plasma applicator is provided. The plasma applicator includes a plasma discharge tube in which plasma can be generated, the plasma discharge tube having a process gas inlet for allowing a plasma process gas to enter the plasma discharge tube, the plasma discharge tube having a longitudinal axis. A microwave cavity at least partially surrounds a portion of the plasma discharge tube. The plasma applicator includes a coupling iris at which microwave energy can be coupled to the microwave cavity such that the microwave energy can generate a plasma in the portion of the plasma discharge tube. The microwave cavity has three orthogonal dimensions including a length, a width and a height, at least two of the orthogonal dimensions being selected such that the microwave energy in the microwave cavity propagates in a transverse electric (TE) mode.

In some embodiments, primary electric fields generated from the microwave energy combine with an evanescent electric field generated from the coupling iris, such that a combined electric field in the microwave cavity is substantially uniform along the longitudinal axis of the plasma discharge tube.

In some embodiments, the microwave energy has a power of approximately 1 kW.

In some embodiments, a length of the plasma discharge tube is approximately 11 inches.

In some embodiments, an outer diameter of the plasma discharge tube is approximately one inch.

In some embodiments, a width of the microwave cavity is approximately three inches.

In some embodiments, a length of the microwave cavity is approximately 4.5 inches.

In some embodiments, a source of the microwave energy comprises a solid state generator.

In some embodiments, a source of the microwave energy comprises a magnetron.

In some embodiments, the plasma discharge tube is made of a material including at least one of quartz, sapphire, ceramic, aluminum nitride and boron nitride.

In some embodiments, the process gas comprises at least one of oxygen, nitrogen, hydrogen, fluorinated gas, forming gas, $NF_3$, $NH_3$, $C_2F_4$, and $C_2F_6$.

In some embodiments, the plasma applicator further comprises a plurality of radial microwave chokes disposed over an exterior of the plasma discharge tube and disposed at ends of the microwave cavity for substantially containing the microwave energy in the microwave cavity, positions of the microwave chokes being such that microwave energy propagating in the TE mode and the transverse electric magnetic (TEM) mode is attenuated. In some embodiments, the plurality of radial microwave chokes comprise a first inner choke and a first outer choke located at a first end of the microwave cavity and a second inner choke and a second outer choke located at a second end of the microwave cavity, a first space between the first inner choke and the first outer choke and a second space between the second inner choke and the second outer choke being selected to provide attenuation of the microwave energy propagating in the TE mode and the TEM mode. The first and second spaces can be substantially equal, and, in a particular exemplary embodiment, at least one of the spaces is approximately 0.38 inch.

According to another aspect, a plasma applicator is provided. The plasma applicator includes a plasma discharge tube in which plasma can be generated, the plasma discharge tube having a process gas inlet for allowing a plasma process gas to enter the plasma discharge tube, the plasma discharge tube having a longitudinal axis. A microwave cavity at least partially surrounds a portion of the plasma discharge tube. The plasma applicator includes a coupling iris at which microwave energy can be coupled to the microwave cavity such that the microwave energy can generate a plasma in the portion of the plasma discharge tube. Primary electric fields generated from the microwave energy combine with an evanescent electric field generated from the coupling iris, such that a combined electric field in the microwave cavity is substantially uniform along the longitudinal axis of the plasma discharge tube.

In some embodiments, the microwave cavity has three orthogonal dimensions including a length, a width and a height, at least two of the orthogonal dimensions being selected such that the microwave energy in the microwave cavity propagates in a transverse electric (TE) mode.

In some embodiments, the plasma applicator further comprises a plurality of radial microwave chokes disposed over an exterior of the plasma discharge tube and disposed at ends of the microwave cavity for substantially containing the microwave energy in the microwave cavity, positions of the microwave chokes being such that microwave energy propagating in the TE mode and the transverse electric magnetic (TEM) mode is attenuated. In some embodiments, the plurality of radial microwave chokes comprise a first inner choke and a first outer choke located at a first end of the microwave cavity and a second inner choke and a second outer choke located at a second end of the microwave cavity, a first space between the first inner choke and the first outer choke and a second space between the second inner choke and the second outer choke being selected to provide attenuation of the microwave energy propagating in the TE mode and the TEM mode. The first and second spaces can be substantially equal, and, in a particular exemplary embodiment, at least one of the spaces is approximately 0.38 inch.

In some embodiments, the microwave energy has a power of approximately 1 kW.

In some embodiments, a length of the plasma discharge tube is approximately 11 inches.

In some embodiments, an outer diameter of the plasma discharge tube is approximately one inch.

In some embodiments, a width of the microwave cavity is approximately three inches.

In some embodiments, a length of the microwave cavity is approximately 4.5 inches.

In some embodiments, a source of the microwave energy comprises a solid state generator.

In some embodiments, a source of the microwave energy comprises a magnetron.

In some embodiments, the plasma discharge tube is made of a material including at least one of quartz, sapphire, ceramic, aluminum nitride and boron nitride.

In some embodiments, the process gas comprises at least one of oxygen, nitrogen, hydrogen, fluorinated gas, forming gas, $NF_3$, $NH_3$, $C_2F_4$, and $C_2F_6$.

According to another aspect, a plasma applicator is provided. The plasma applicator includes a plasma discharge tube in which plasma can be generated, the plasma discharge tube having a process gas inlet for allowing a plasma process gas to enter the plasma discharge tube, the plasma discharge tube having a longitudinal axis. A microwave cavity at least partially surrounds a portion of the plasma discharge tube. The plasma applicator includes a coupling iris at which microwave energy can be coupled to the microwave cavity such that the microwave energy can generate a plasma in the portion of the plasma discharge tube. A plurality of radial microwave chokes is disposed over an exterior of the plasma discharge tube and disposed at ends of the microwave cavity for substantially containing the microwave energy in the microwave cavity, positions of the microwave chokes being such that microwave energy propagating in a transverse electric (TE) mode and a transverse electric magnetic (TEM) mode is attenuated.

In some embodiments, the plurality of radial microwave chokes comprise a first inner choke and a first outer choke located at a first end of the microwave cavity and a second inner choke and a second outer choke located at a second end of the microwave cavity, a first space between the first inner choke and the first outer choke and a second space between the second inner choke and the second outer choke being selected to provide attenuation of the microwave energy propagating in the TE mode and the TEM mode. The first and second spaces can be substantially equal, and, in a particular exemplary embodiment, at least one of the spaces is approximately 0.38 inch.

In some embodiments, the microwave cavity has three orthogonal dimensions including a length, a width and a height, at least two of the orthogonal dimensions being selected such that the microwave energy in the microwave cavity propagates in a transverse electric (TE) mode.

In some embodiments, primary electric fields generated from the microwave energy combine with an evanescent electric field generated from the coupling iris, such that a combined electric field in the microwave cavity is substantially uniform along the longitudinal axis of the plasma discharge tube.

In some embodiments, the microwave energy has a power of approximately 1 kW.

In some embodiments, a length of the plasma discharge tube is approximately 11 inches.

In some embodiments, an outer diameter of the plasma discharge tube is approximately one inch.

In some embodiments, a width of the microwave cavity is approximately three inches.

In some embodiments, a length of the microwave cavity is approximately 4.5 inches.

In some embodiments, a source of the microwave energy comprises a solid state generator.

In some embodiments, a source of the microwave energy comprises a magnetron.

In some embodiments, the plasma discharge tube is made of a material including at least one of quartz, sapphire, ceramic, aluminum nitride and boron nitride.

In some embodiments, the process gas comprises at least one of oxygen, nitrogen, hydrogen, fluorinated gas, forming gas, $NF_3$, $NH_3$, $C_2F_4$, and $C_2F_6$.

BRIEF DESCRIPTION OF THE DRAWINGS

The present disclosure is further described in the detailed description which follows, in reference to the noted plurality of drawings by way of non-limiting examples of embodiments of the present disclosure, in which like reference numerals represent similar parts throughout the several views of the drawings.

FIG. 6A includes a schematic perspective view of a portion of cooling jacket, illustrating IR transparent windows, according to exemplary embodiments.

FIG. 6B includes a schematic perspective view of one of IR-transparent windows illustrated in FIG. 6A, according to exemplary embodiments.

DETAILED DESCRIPTION OF PREFERRED EMBODIMENTS

Figure 1:
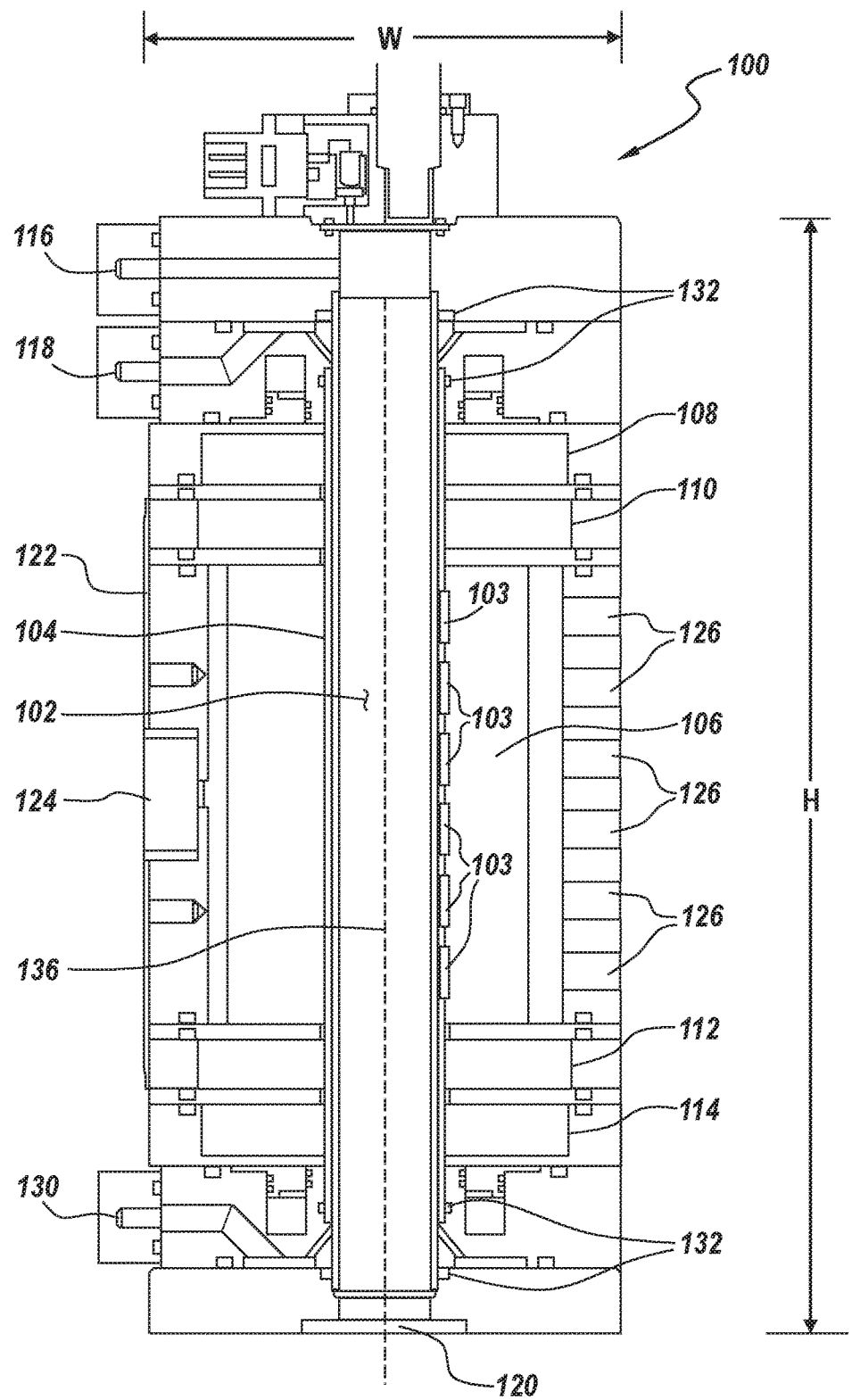
FIG. 1 includes a schematic cross-sectional diagram of a compact, low-power plasma applicator, according to exemplary embodiments.

FIG. 1 includes a schematic cross-sectional diagram of a compact, low-power plasma applicator 100, according to exemplary embodiments. Referring to FIG. 1, plasma applicator 100 includes a plasma discharge tube 102 having a longitudinal axis 136, in which one or more process gases are excited by microwave energy coupled into a microwave cavity 106 at least partially surrounding plasma discharge tube 102. In some exemplary embodiments, the process gas comprises at least one of oxygen, nitrogen, hydrogen, fluorinated gas, forming gas, $NF_3$, $NH_3$, $C_2F_4$, and $C_2F_6$, or one or more other process gases. The microwave energy is directed into the microwave cavity 106 via a coupling iris 124 from a microwave waveguide (not shown) coupled to the outer housing 122 of plasma applicator 100 at coupling iris 124. In exemplary embodiments, plasma applicator 100 includes air-filled radial waveguide chokes 108, 110, 112, 114, which are sized and located as shown in pairs at opposite ends of and surrounding plasma discharge tube 102 to provide containment of the microwave energy within microwave cavity 106. That is, the sizes and relative positions with respect to microwave cavity 106 and each other are such that the microwave energy is substantially prevented from propagating out of microwave cavity 106. Process gas used in generating the plasma enters plasma discharge tube 102 at a process gas inlet 116. The resulting plasma products exit plasma discharge tube 102 for use in the desired application processing through an outlet 120.

Plasma applicator 100 also includes a cooling jacket 104 at least partially surrounding plasma discharge tube 102. Cooling jacket 104 contains a cooling fluid circulating around the exterior of plasma discharge tube 102 to control temperature, i.e., provide cooling, of plasma discharge tube 102. According to exemplary embodiments, plasma applicator 100 operates at relatively low power, e.g., approximately 1 kW, such that the cooling fluid circulating in cooling jacket 104 can be a gas, such as air. That is, in some exemplary embodiments, because of the low-power operation of plasma applicator 100, liquid, i.e., water, cooling is not required. Cooling jacket 104 includes an air cooling inlet 118, through which the cooling air enters cooling jacket 104. The air circulates through cooling jacket 104 and exits cooling jacket 104 at air cooling outlet 130. Cooling jacket 104 can be sealed to the exterior of plasma discharge tube 102 by O-ring seals 132.

As noted above, plasma applicator 100 is a compact, low-power generator, having a height H and a width W. In some exemplary embodiments, the height H can be approximately 11 inches, and the width W can be approximately 3.5 inches. As noted above, plasma applicator 100 can operate at relatively low microwave power, which in some particular exemplary embodiments is approximately 1 kW, and can be up to 1.5 kW.

Figure 2A:
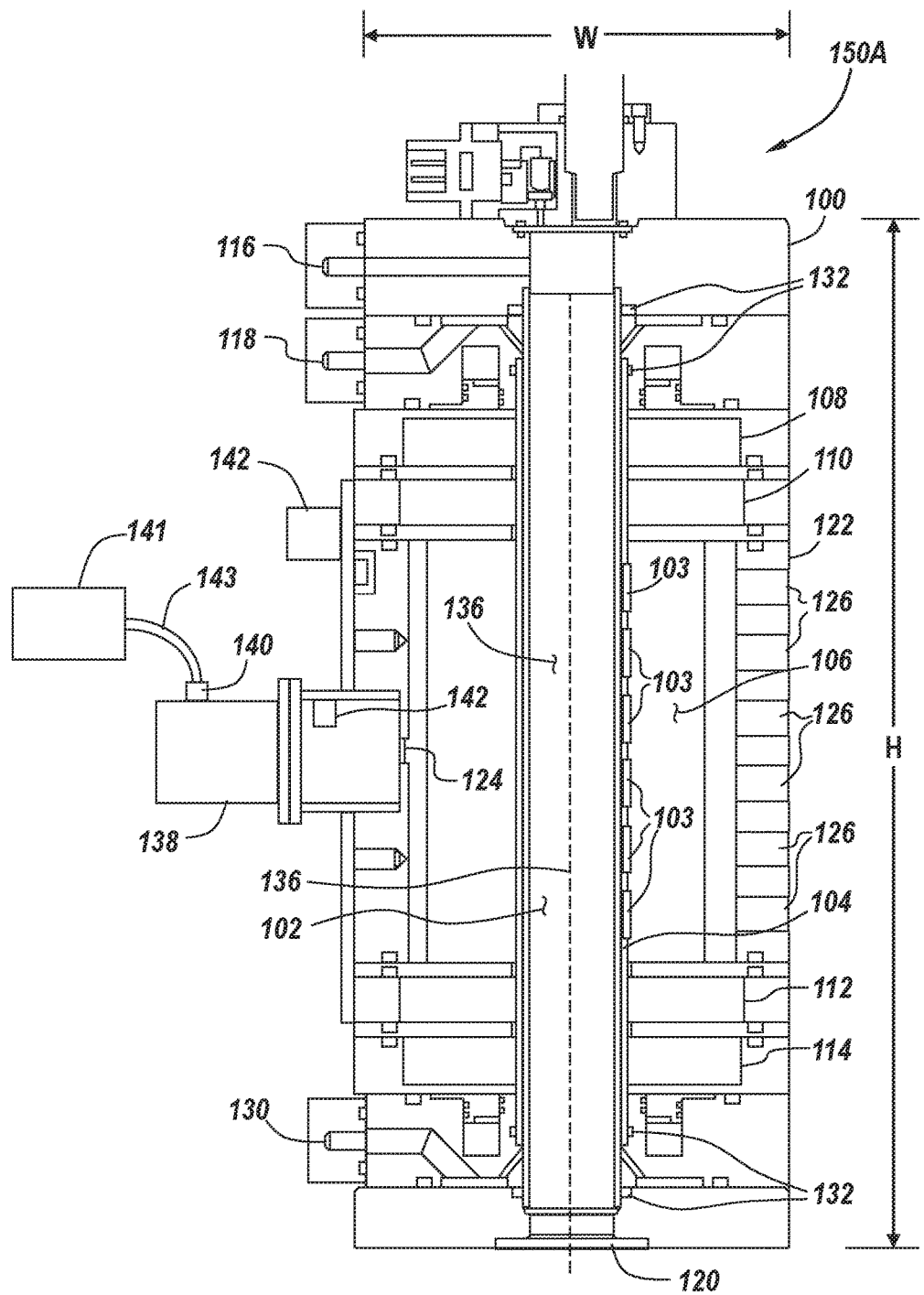
FIGS. 2A and 2B include schematic block diagrams of two plasma generation systems, which include the plasma applicator of FIG. 1, according to exemplary embodiments.
Figure 2B:
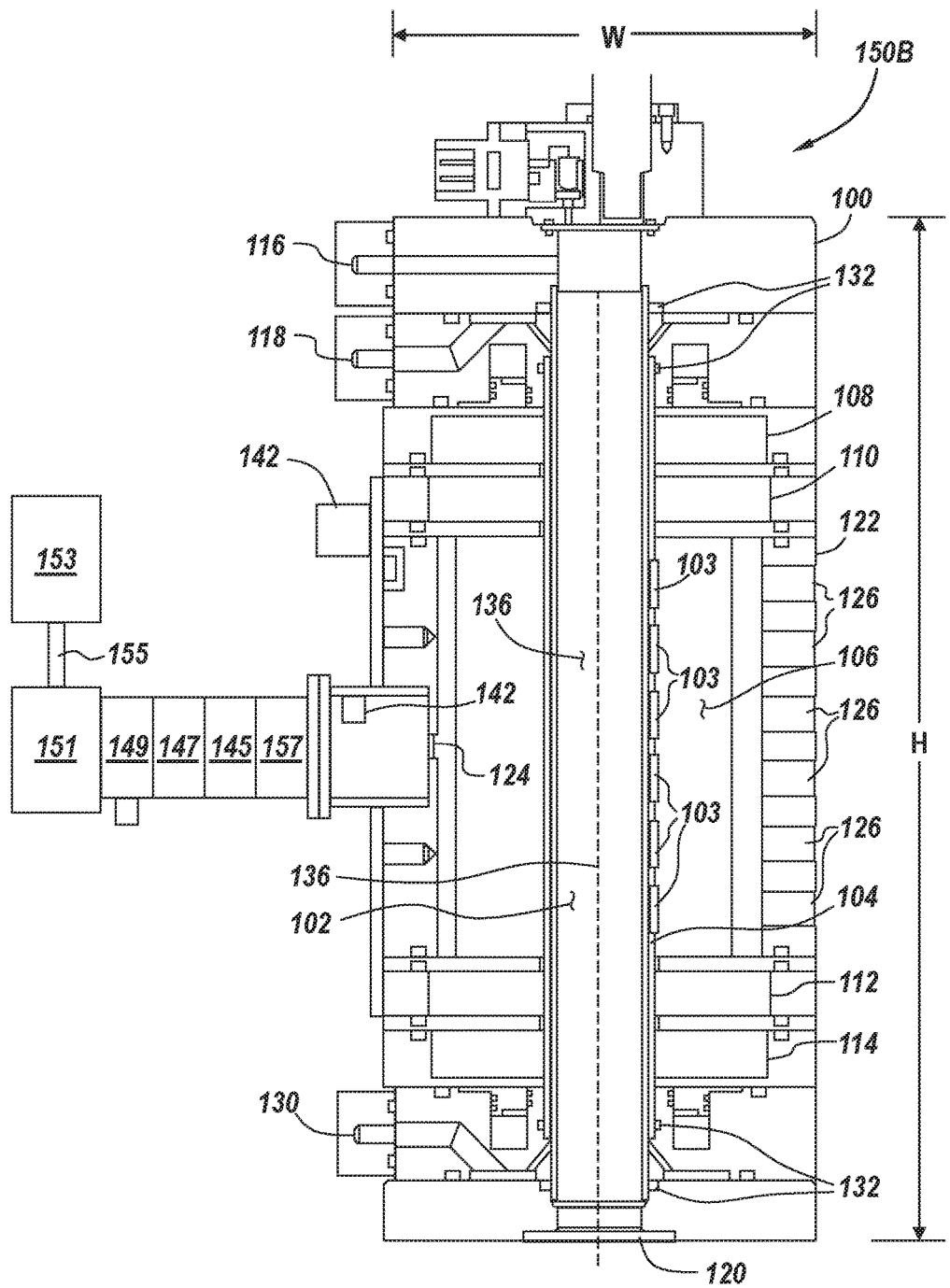

FIGS. 2A and 2B include schematic block diagrams of two plasma generation systems 150A and 150B, which include plasma applicator 100 of FIG. 1, according to exemplary embodiments. FIG. 2A illustrates two different alternative coupling structures which can be used to integrate a solid state microwave generator 141 via a coaxial cable 143. One structure includes a coax feed 142 which directly couples to applicator 100 via a coax connector, at which coaxial cable 143 can be connected. Another structure includes a waveguide feed 138 for coupling microwave excitation energy to microwave cavity 106 via coupling iris 124. A coax-to-waveguide transition 140 couples the microwave energy from solid state microwave generator 141 via a coaxial cable 143 to waveguide feed 138. The waveguide feed provides the additional advantage of a fixed tuning stub 142 or binary tuning, which is used to provide one tuning position for ignition of the plasma and one fixed position for operation. This structure provides additional tuning enhancement to the automatic frequency tuning by the solid state generator 141. It is noted that FIG. 2A illustrates the solid state microwave generator 141 connected via coaxial cable 143 to coax-to-waveguide transition 140. In the case in which the coax feed 142 is used, coax cable 143 is directly connected to a coax connector on which directly couples to applicator 100 via a coax connector on waveguide feed 142.

FIG. 2B illustrates plasma generation system 150B using a magnetron, instead of solid state generator 141 of FIG. 2A. Referring to FIG. 2B, a high-voltage DC power supply 153 applies power to magnetron head 151 via high-voltage cabling 155. An isolator 149 isolates magnetron head 151 from applicator 100 such that any power reflected back from applicator 100 is blocked to prevent damage to magnetron head 151. A dual-directional coupler 147 measures and couples power between magnetron head 151 and applicator 100. Microwave energy coupled to applicator 100 is tuned by a triple stub auto-tuner 157.

Various plasma applicators are described in U.S. Pat. Nos. 5,961,851; 7,183,514; 5,498,308; 6,263,830; 8,048,329; 7,562,638; 7,554,053; and 6,439,155. Those U.S. Patents, all of which name at least one inventor named in the present application, are incorporated herein in their entirety by reference. In prior plasma applicators, for example, the plasma applicator described in U.S. Pat. No. 5,961,851, multiple microwave cavities operate in the $TM_{mnp}$ (transverse magnetic) mode to create an elongated excitation field. Plasma contraction within the microwave cavity is a function of process gas pressure, and, as the pressure increases, the plasma tends to concentrate in the central portion of each of the individual cavities.

Furthermore, in previously known techniques, as described for example in U.S. Pat. Nos. 5,961,851 and 8,048,329, microwave chokes are used in either a single or a dual configuration to reduce E-field intensity for the TEM (transverse electric-magnetic) mode. The dual configuration is designed such that the chokes are configured adjacent to each other to reduce microwave penetration past the plasma discharge tube. These adjacent configurations, which are primarily based on quarter-wavelength design, provide attenuation that is efficient only for the TEM mode configuration.

In contrast, in the plasma applicator 100 of the exemplary embodiments, microwave excitation is generated in microwave cavity 106 in the TE (transverse electric) mode. Microwave chokes 108, 110, 112, 114 of the exemplary embodiments attenuate the electric fields for both the TE and TEM modes simultaneously. As described herein in detail, the position of the chokes 108, 110, 112, 114 with respect to microwave cavity 106 and with respect to each other is selected to achieve efficient operation of the chokes 108, 110, 112, 114 for attenuation of both TE and TEM modes.

It is desirable that the electric field in the microwave cavity be uniform such that the resulting plasma is also uniform. In previous plasma applicators, in an effort to achieve uniformity of the electric field, multiple cavities are constructed adjacent to each other, which can be bulky and extensive in length. In these systems, the plasma formation within each individual applicator tube is dependent on the pressure. As the pressure increases, the plasma tends to contract within the tube and collapse or concentrate within the central part of the plasma tube. This is due to the fact that adequate electric field is not available to prevent the plasma from contracting.

Also, in these prior systems, the microwave chokes are designed adjacent to each other, without any optimization of the distance between the chokes to effect desired electric field attenuation. The performance of these prior configurations is based on either resonant or non-resonant quarter-wavelength topology, and is not as efficient as that of the present embodiments.

According to the exemplary embodiments illustrated in FIGS. 1 and 2, plasma applicator 100 is of a $TE_{mnp}$ (transverse electric) type electric field configuration, as opposed to the $TM_{mnp}$ (transverse magnetic) type configuration used in prior applicators and prior art. According to the exemplary embodiments, two conjoining electric fields cover essentially the entire length of plasma discharge tube 102. The portion of the conjoining fields where there exists only a partial field, which is laterally adjacent to coupling iris 124, is filled and completed with the "near field" intensity generated by coupling iris 124. Thus, according to the exemplary embodiments, the conjoined electric field within plasma discharge tube 102 is achieved via a combination of the primary mode plus the evanescent field generated by coupling iris 124.

The following equations (1) define magnetic and electric field intensity in three-dimensional space, (x, y, z), within microwave cavity 106, according to exemplary embodiments.

$$H_y = -\frac{C}{k_c^2}\left(\frac{p\pi}{d}\right)\left(\frac{n\pi}{b}\right)\cos\frac{m\pi x}{a}\sin\frac{n\pi y}{b}\cos\frac{p\pi z}{d} \quad (1)$$

$$E_z = \frac{j\omega\mu C}{k_c^2}\left(\frac{n\pi}{b}\right)\cos\frac{m\pi x}{a}\sin\frac{n\pi y}{b}\sin\frac{p\pi z}{d}$$

-continued $$E_v = -\frac{j\omega\mu C}{k_c^2}\left(\frac{m\pi}{a}\right)\sin\frac{m\pi x}{a}\cos\frac{n\pi y}{b}\sin\frac{p\pi z}{d}$$

$$k_c^2 = \left(\frac{m\pi}{a}\right)^2 + \left(\frac{n\pi}{b}\right)^2$$

$$\beta = \left[\left(\frac{2\pi}{\lambda}\right)^2 - k_c^2\right]^{1/2} = \frac{p\pi}{d}$$

$$k = \frac{2\pi}{\lambda} = \left[\left(\frac{m\pi}{a}\right)^2 + \left(\frac{n\pi}{b}\right)_c^2 + \left(\frac{p\pi}{d}\right)^2\right]^{1/2}.$$

Figure 3A:
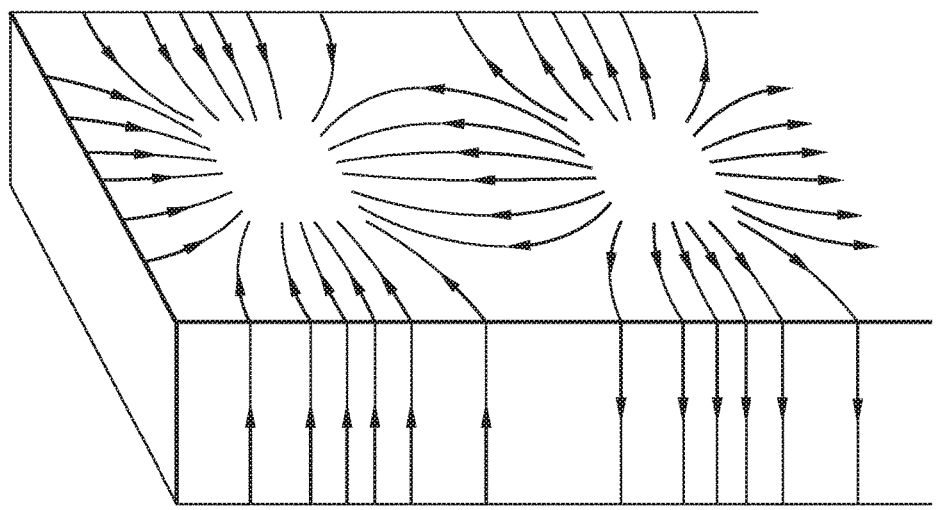
FIGS. 3A and 3B are schematic diagrams illustrating propagation and field patterns for a rectangular $TE_{10}$ mode waveguide.
Figure 3B:
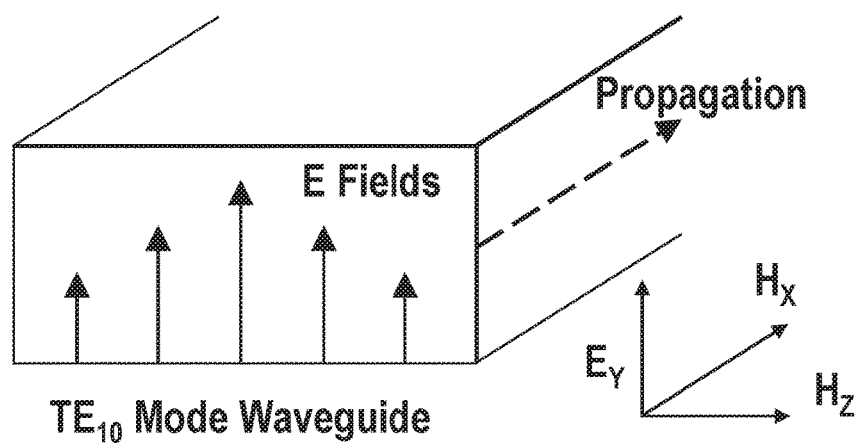

Equations (2) below define electric and magnetic field patterns for a rectangular $TE_{10}$ mode waveguide. FIGS. 3A and 3B are schematic diagrams illustrating propagation and field patterns for the rectangular $TE_{10}$ mode waveguide.

$$E_v = E_0\sin\frac{\pi x}{a} \quad (2)$$

$$H_x = -\left(\frac{E_0}{Z_{TE}}\right)\sin\left(\frac{\pi x}{a}\right)$$

$$H_z = \frac{jE_0}{\eta}\left(\frac{\lambda}{2a}\right)\cos\frac{\pi x}{a}$$

$$H_v = 0 = E_x$$

$$Z_{TE} = \frac{\eta}{\sqrt{1-(\lambda/2a)^2}}$$

$$\upsilon_p = \frac{1}{\sqrt{\mu\epsilon}\sqrt{1-(\lambda/2a)^2}}$$

$$\upsilon_s = \frac{1}{\sqrt{\mu\epsilon}}\sqrt{1-(\lambda/2a)^2}$$

$$\lambda_0 = 2a$$

$$f_c = \frac{1}{2a\sqrt{\mu\epsilon}}.$$

Referring to equations (1), for this particular embodiment, the integer p is chosen to be 0 (zero), such that the resonance is independent of the height of microwave cavity 106, the height being measured in the direction of longitudinal axis 136. By adjusting the height to a large enough value, the two conjoining electric fields of the exemplary embodiments are obtained. In some particular exemplary embodiments, the approximate width of microwave cavity 106 is 3 inches, and the approximate height is 4.5 inches. With these cavity dimensions, the two conjoining electric fields of the exemplary embodiments are achieved.

Thus, according to exemplary embodiments, conjoining electric fields are generated in the single microwave cavity 106 to generate an elongated field along plasma discharge tube 102. The conjoining fields are connected and completed as a uniform field by the "near field" evanescent radiation generated from coupling iris 124. This uniform elongated field formed by two single electric fields and the evanescent radiation enables plasma applicator 100 to operate at higher pressures up to and over 10 Torr while maintaining plasma formation and uniformity. The uniform elongated field also provides uniform plasma formation and uniform temperature along plasma discharge tube 102, enabling the use of such tube materials which are generally considered fragile and subject to damage in prior more harsh plasma formation environments. For example, according to exemplary embodiments, plasma discharge tube 102 can be formed of a material such as sapphire, quartz, ceramics, aluminum nitride, boron nitride and/or other similar materials.

According to the exemplary embodiments, the plasma formation within plasma discharge tube 102 is independent of the pressure and maintains its formation as the process pressure is increased. The plasma will not collapse and concentrate within the central portion of plasma discharge tube 102. The uniform elongated field prevents the concentration of the plasma and forces the plasma to maintain its formation within plasma discharge tube 102.

According to exemplary embodiments, microwave energy is coupled into microwave cavity 106 via coupling iris 124. It is noted that, in equations (1) and (2), indices x, y, z represent the width, depth and height (length), respectively, of the microwave cavity (waveguide). In some exemplary embodiments, the dimensions of waveguide cavity 106 are selected as described above according to equations (1) and (2), wherein equations (1) calculate and define the conjoining field formation within microwave cavity 106 of $TE_{mnp}$, and equation (2) calculates and defines the $TE_{10}$ waveguide parameters for the transfer of energy from the microwave power source, which, as described above in detail, can be, for example, solid state generator 141 or magnetron 151.

According to exemplary embodiments, two conjoining electric fields are generated in plasma discharge tube 102. As described above, the portion of the conjoining fields where there exists only a partial field, located laterally opposite coupling iris 124, is filled and completed with the "near field" intensity generated by coupling iris 124. Thus, as noted above, the conjoined electric field is achieved via a combination of the primary mode plus the evanescent field generated by coupling iris 124, resulting in a substantially uniform electric field extending along the longitudinal axis of plasma discharge tube 102.

As described above in detail, exemplary plasma applicator 100 operates in $TE_{mnp}$ mode. In a particular exemplary embodiment, the integers m, n, and p are 1, 1 and 0, respectively. Since the integer p defining the height is set to zero (0), the height of microwave cavity 106 is independent of the mode. Therefore, by choosing a length twice that of the $TE_{110}$ height, two independent electric fields can be formed separated by a small distance, being weakly connected by the residual intensity of each electric field at the combining end. Coupling iris 124, designed to transfer and couple the microwave energy to plasma applicator 100, has a very strong near field evanescent mode, which can extend deep into to the interior part of plasma applicator 100, where the two independent electric fields are disposed and weakly connected via the weak residual fields of the $TE_{110}$ mode. The two independent electric fields are conjoined and combined via the much stronger evanescent mode emitted from coupling iris 124, thereby creating a substantially uniform electric field along longitudinal axis 136 of plasma discharge tube 102.

Figure 4A:
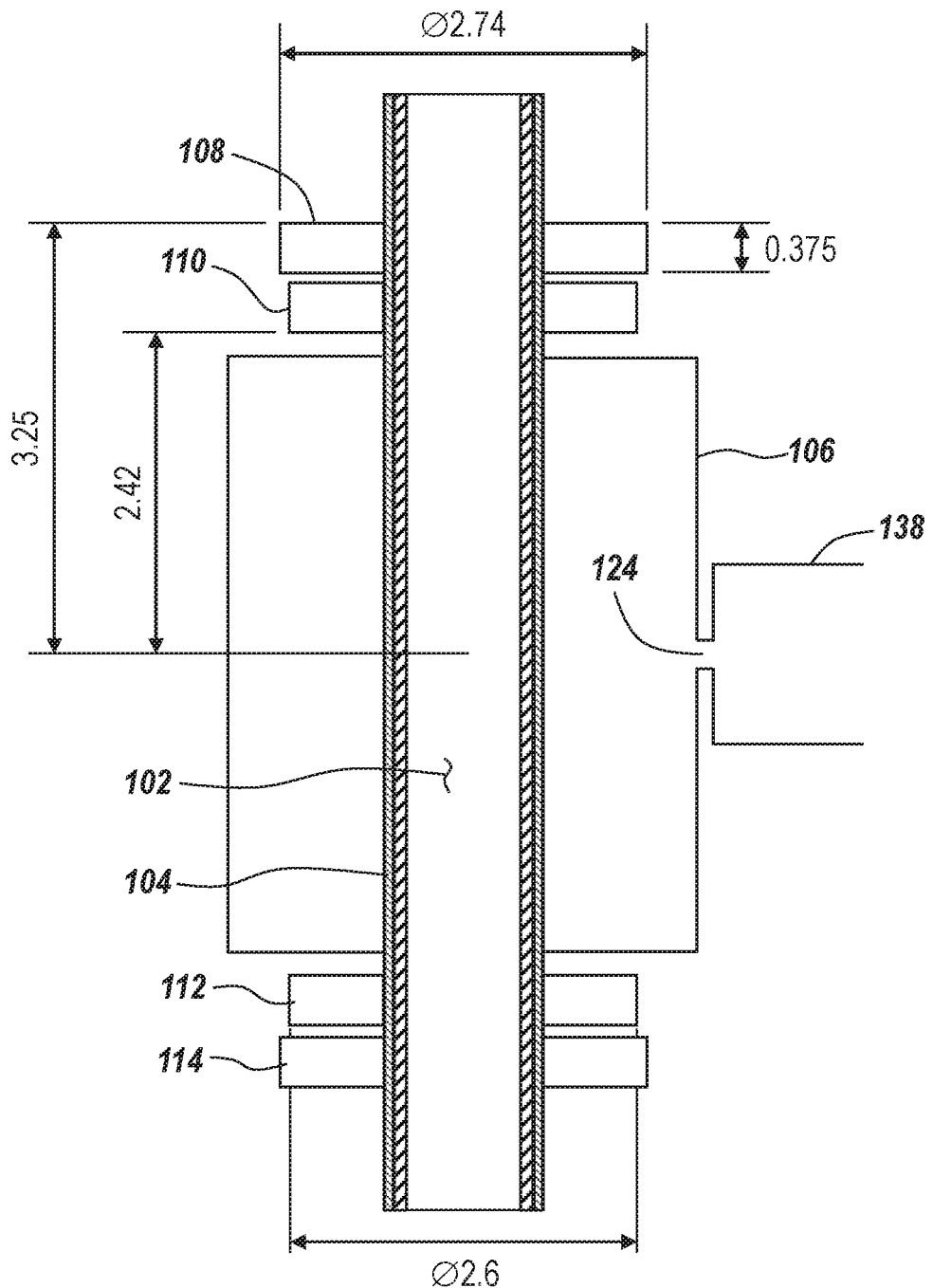
FIG. 4A is a schematic diagram of a plasma applicator in which chokes are not optimally positioned with respect to each other.
Figure 4B:
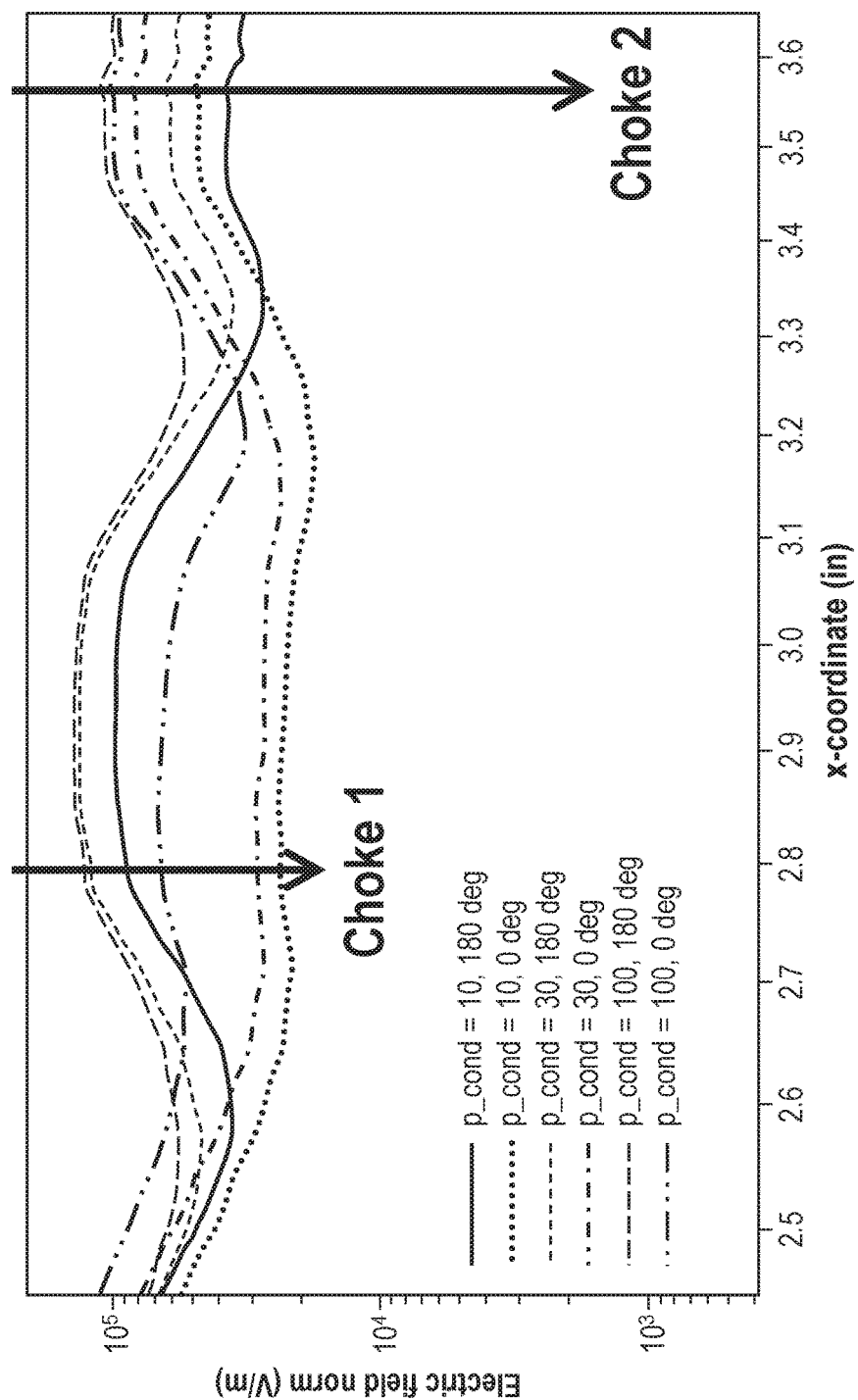
FIG. 4B includes graphs illustrating the resulting electric field attenuation in a microwave cavity of a plasma applicator for multiple plasma density conditions, resulting from the choke positions illustrated in FIG. 4A.
Figure 5A:
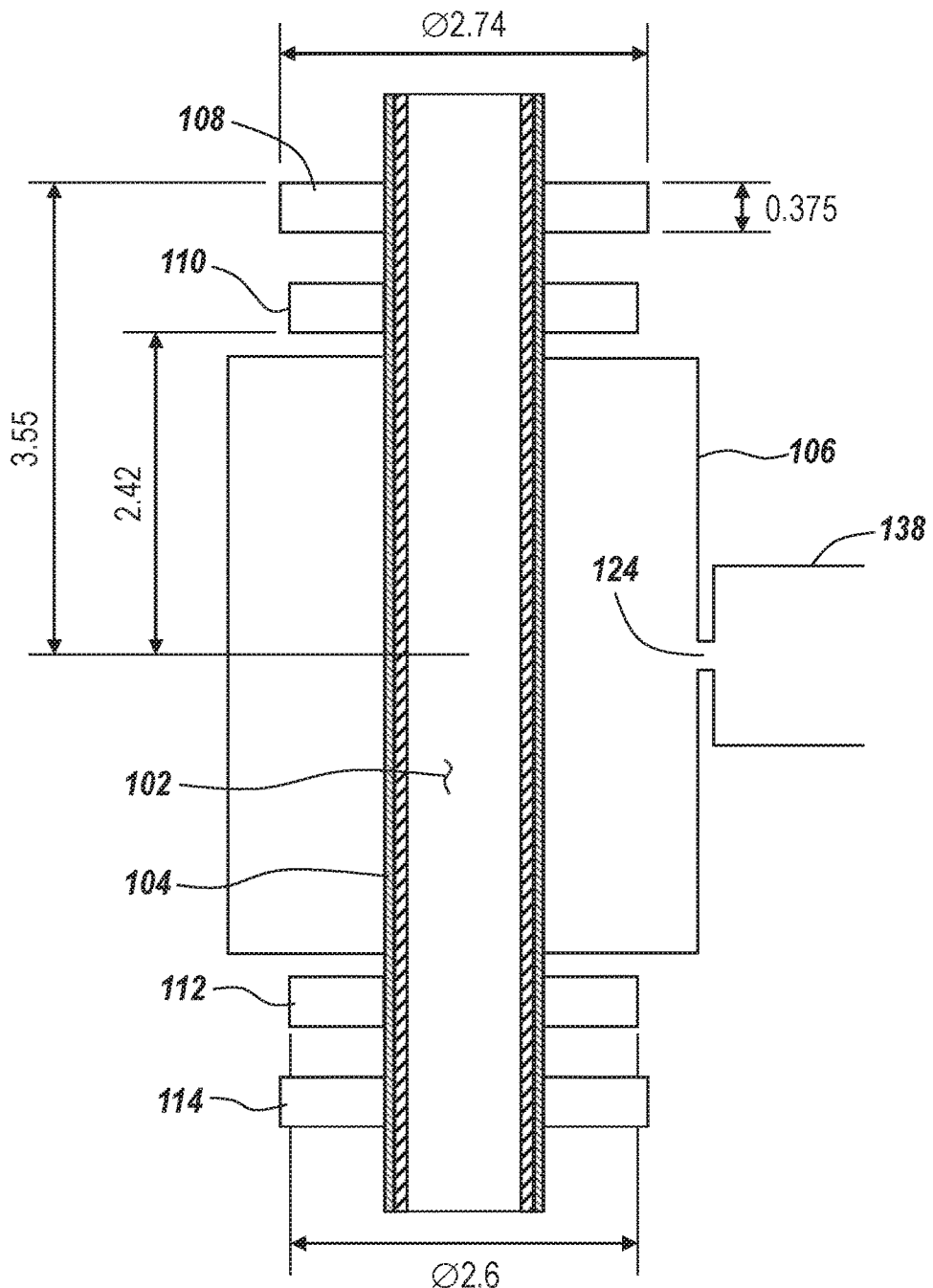
FIG. 5A is a schematic diagram of a plasma applicator in which chokes are optimally positioned with respect to each other, according to exemplary embodiments.

FIGS. 4A, 4B, 5A and 5B illustrate the effect of the position of microwave chokes 108, 110, 112, 114 on attenuation of electric field in microwave cavity 106, and, therefore containment of electric field within microwave cavity 106, according to exemplary embodiments. Specifically, FIG. 4A is a schematic diagram of plasma applicator 100 in which chokes are not optimally positioned with respect to each other according to exemplary embodiments, and FIG. 4B includes graphs illustrating the resulting electric field attenuation in microwave cavity 106, for multiple plasma density conditions. FIG. 5A is a schematic diagram of plasma applicator 100 in which chokes are optimally positioned with respect to each other according to exemplary embodiments, and FIG. 5B includes graphs illustrating the resulting electric field attenuation in microwave cavity 106, for multiple plasma density conditions.

Referring to FIGS. 4A, 4B, 5A and 5B the inner chokes 110 and 112 are referred to as "Choke 1," and the outer chokes 108 and 114 are referred to as "Choke 2." The relative distances of the second chokes 108 and 114, with respect to the first chokes 110 and 112, respectively, is recognized according to the exemplary embodiments as enhancing the attenuation efficiency of the combined structure. Also, the field intensity in the chokes is very low, indicating significant attenuation. As illustrated in the figures, in the exemplary embodiments, chokes 108, 110, 112, 114 are disposed at both ends of microwave cavity 106. In some embodiments, chokes 108, 110, 112, 114 are filled with a quartz material such that the diameter of the radial waveguide structure can be made relatively small to enhance compactness of the system. Other choke fill materials, such as, for example, ceramic, sapphire and other dielectric materials, can be used. Also, for example, in other embodiments, chokes 108, 110, 112, 114 are filled with air.

Referring to FIGS. 4A and 4B, the configuration does not include optimized spacing between inner chokes 110, 112 and respective outer chokes 108, 114. In the exemplary illustration of FIG. 4A, the nominal space between respective inner and outer chokes is approximately 0.08 inch. Referring to the corresponding intensity curves of FIG. 4B, the illustrated resulting attenuation at the chokes, i.e., Choke 1 and Choke 2, is insignificant. That is, without optimized positioning of the chokes, in particular, spacing between the chokes, very little or no electric field attenuation is realized.

Figure 5B:
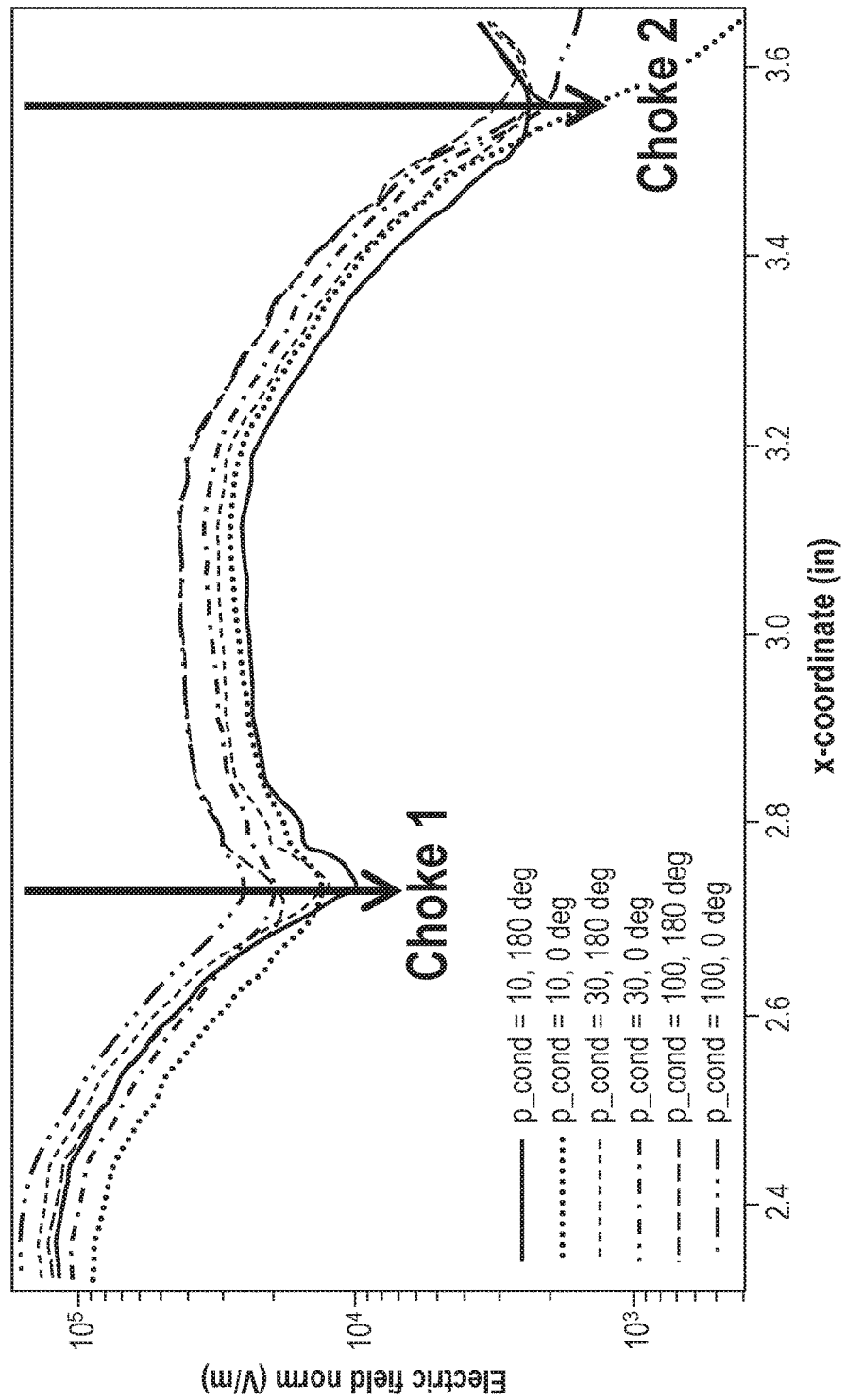
FIG. 5B includes graphs illustrating the resulting electric field attenuation in a microwave cavity of a plasma applicator for multiple plasma density conditions, resulting from the choke positions illustrated in FIG. 5A.

In contrast, referring to FIGS. 5A and 5B, the configuration does include optimized spacing between inner chokes 110, 112 and respective outer chokes 108, 114. In the exemplary illustration of FIG. 5A, the nominal space between respective inner and outer chokes is approximately 0.38 inch. Referring to the corresponding intensity curves of FIG. 5B, the illustrated resulting attenuation at the chokes, i.e., Choke 1 and Choke 2, is far more significant than the case of FIGS. 4A and 4B. That is, with optimized positioning of the chokes, in particular, spacing between the chokes, a substantial improvement in electric field attenuation is realized.

According to exemplary embodiments, the feature that results in the distance between chokes affecting performance in optimal attenuation between two adjacent chokes is the presence of the $TE_{mnp}$ mode, which has a wavelength described according to the last line in equations (1):

$$k = \frac{2\pi}{\lambda} = \left[\left(\frac{m\pi}{a}\right)^2 + \left(\frac{n\pi}{b}\right)_c^2 + \left(\frac{p\pi}{d}\right)^2\right]^{1/2}.$$

In a particular exemplary embodiment, for the mode of $TE_{110}$, the wavelength can be calculated to be 4.243", where the integers m, n and p of equations (1) are 1, 1 and 0, respectively. In this exemplary embodiment, dimensions a and b are each 3.0 inches, and frequency f=2,450 MHz. Substituting m=1, n=1, p=0, a=3.0 and b=3.0 into the equation fork above, and solving for λ, yields λ=4.243 inches. According to prior approaches, wavelength is calculated as follows: λ=c/f, where λ is the wavelength, c is the speed of light and f is the frequency. This calculation is applicable to a TEM mode. In contrast, according to exemplary embodiments, for the design frequency of 2,450 MHz, the wavelength of the exemplary system is 4.243 inches. According to the exemplary embodiments, choke separation distance is a function of wavelength, i.e., frequency. For the given exemplary embodiments, at a microwave plasma excitation wavelength of 4.243 inches and choke separation distance of 0.38 inch, a linear multiplying factor, i.e., slope, of 0.38/4.243=0.0896 is obtained. In accordance with the exemplary embodiments, the choke separation distance of 0.38 inch is found to provide optimal attenuation. However, choke separation distances in a range of 0.125-0.625 inch have also been determined to provide acceptable attenuation.

Hence, in accordance with exemplary embodiments, the microwave choke configuration is used to attenuate microwave energy propagating in cavity 106 in TE mode, as opposed to the TM mode of prior systems. The choke configuration also traps or attenuates microwave energy propagating in the TEM mode.

Referring to FIGS. 4A, 4B, 5A and 5B, attenuation is calculated as a ratio of electric field inside the chokes and outside the chokes, averaged over the circumference of plasma discharge tube 102. Choke performance is evaluated over a plasma conductivity range of 10-100 S/m to ensure stable performance over the operating space. In particular exemplary embodiments, as shown in FIG. 5B, electric field is attenuated by a factor of 50-71, depending on plasma impedance. Since power varies according to the square of electric field intensity, the power attenuation is approximately 2,500-5,000.

Hence, the two adjacent chokes at opposite ends of microwave cavity 106, having a radial waveguide topology, are separated by an optimal distance from each other to attenuate a combination of both TE and TEM modes simultaneously. This is unique at least because the microwave surface current is near zero at the chokes for both the TE and TEM modes simultaneously. In exemplary embodiments, the chokes have a diameter matching the outer dimension of microwave cavity 106 and are filled with a quartz material to further reduce diameter for compactness. This microwave choke configuration of the exemplary embodiments, i.e., a radial waveguide configuration separated by a predetermined distance, effectively reduces the electric field intensity, as shown in FIG. 5B, for both the TE and TEM modes. In contrast, as shown in FIG. 4B, the electric field attenuation is poor and minimal where the separation of two chokes is not optimized for both the TE and TEM modes. This is because, without the optimized separation, the microwave surface current of the TE mode at the chokes is not zero and, therefore, minimal attenuation is achieved.

As described above plasma applicator 100 includes cooling jacket 104 at least partially surrounding plasma discharge tube 102. In some embodiments, it is desirable to monitor the temperature of plasma discharge tube 102 through some form of line-of-sight monitoring, such as temperature detection using one or more infrared (IR) detectors. To facilitate such monitoring, plasma cooling jacket 104 can optionally include one or more windows, which can be transparent to the monitoring radiation, for example, IR radiation. FIG. 6A includes a schematic perspective view of a portion of cooling jacket 104, illustrating IR transparent windows 103, according to exemplary embodiments. FIG. 6B includes a schematic perspective view of one of IR-transparent windows 103 illustrated in FIG. 6A, according to exemplary embodiments. Referring to FIGS. 1, 6A and 6B, plasma discharge tube 102 can optionally be formed with multiple openings as shown. Respective multiple IR-transparent windows 103 can be bonded to the exterior surface of cooling jacket 104, the bonding providing a seal between windows 103 and cooling jacket 104. Windows 103 can be aligned with optional monitoring holes 126 such that the interior of plasma discharge tube 102 can be monitored, for example, by the one or more IR detectors. The material of windows 103 can be an IR-transparent material, such as zinc selenide (ZnSe), potassium bromide (KBr), or similar material.

Because plasma applicator 100 operates at low air pressure, it can be challenging to remove sufficient heat from plasma discharge tube 102. According to exemplary embodiments, the gap between cooling jacket 104 and plasma discharge tube 102 is optimized for the best heat removal efficiency. An approach to providing cooling of plasma applicator 100, in particular, plasma discharge tube 102, will now be described in detail. According to exemplary embodiments, two substantially symmetrical constructions at the opposite side of the applicator to provide air cooling for the applicator and water cooling of the flanges.

Figure 7:
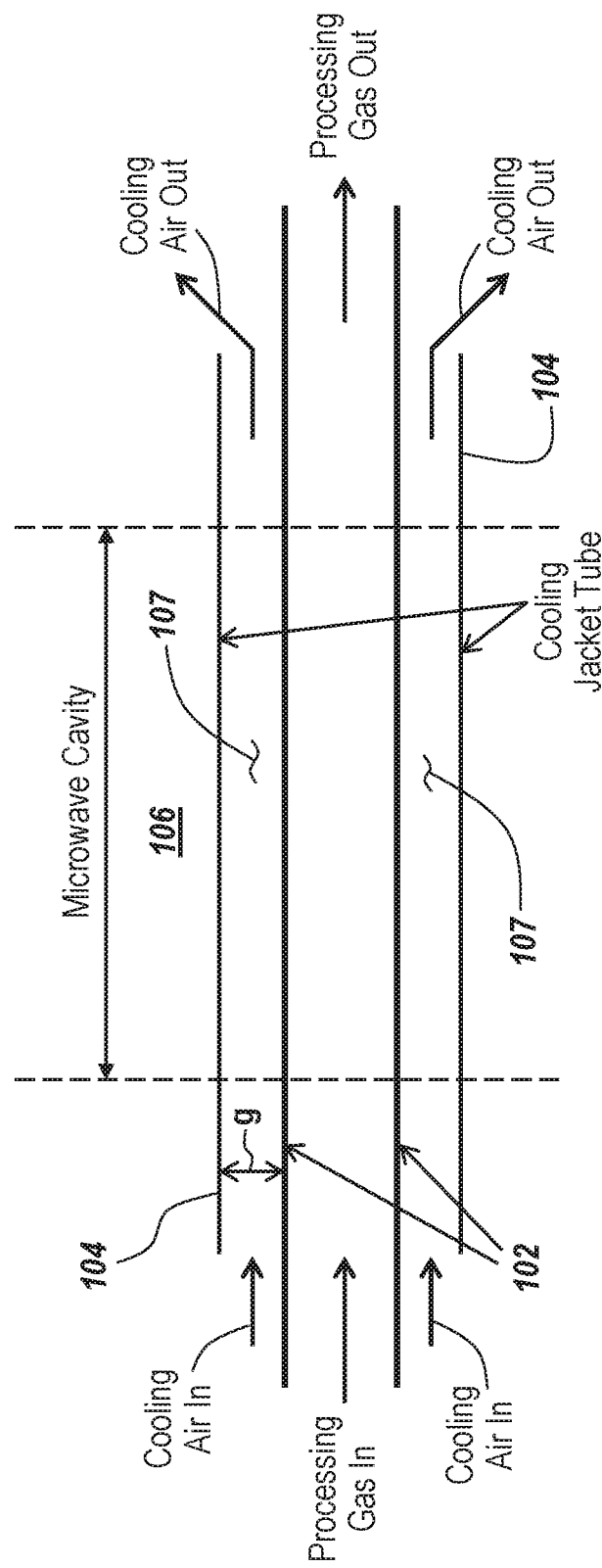
FIG. 7 is a schematic functional diagram of operation of a cooling system for a plasma generating system, according to exemplary embodiments.

According to exemplary embodiments, the forced-air cooling system in plasma applicator 100 obtains the lowest temperature at plasma discharge tube 102 in a large range of the capacity of a compressed air system. FIG. 7 is a schematic functional diagram of operation of the cooling system for plasma generating system 150, according to exemplary embodiments. Referring to FIG. 7, a processing gas enters plasma discharge tube 102 at a first end, is coupled with the microwave energy in microwave cavity 106 to generate the plasma, and exits at the opposite end of plasma discharge tube 102. Cooling jacket 104, which is another tube that is larger in diameter than plasma discharge tube 102 is concentrically aligned with plasma discharge tube 102 to at least partially surround and enclose plasma discharge tube 102. Gap (g) 107 between plasma discharge tube 102 and cooling jacket 104 provides a passage for the forced air to cool plasma discharge tube 102.

According to exemplary embodiments, gap g between plasma discharge tube 102 and cooling jacket 104 is a dimension that is optimized. For a given air system, g determines the heat transfer coefficient (h) and air flow rate (f). As g increases, f also increases, but h decreases. The size of gap g is selected to optimize air flow rate and heat transfer coefficient. In some exemplary embodiment, plasma discharge tube has an outer diameter (OD) of 1.00 inch (25.4 mm). Various standard-size cooling jackets 104, having different inside diameters (ID), such as 26mm, 27mm, 28mm, 29mm and 30mm would operate with a 1.00-inch OD plasma discharge tube 102. Among these possible cooling jackets 104, it has been determined by simulation and empirical data that the cooling jacket having an ID of 27 mm provides the lowest temperature at the plasma discharge tube 102. This results in the size of the gap g being approximately 0.8 mm.

Figure 8:
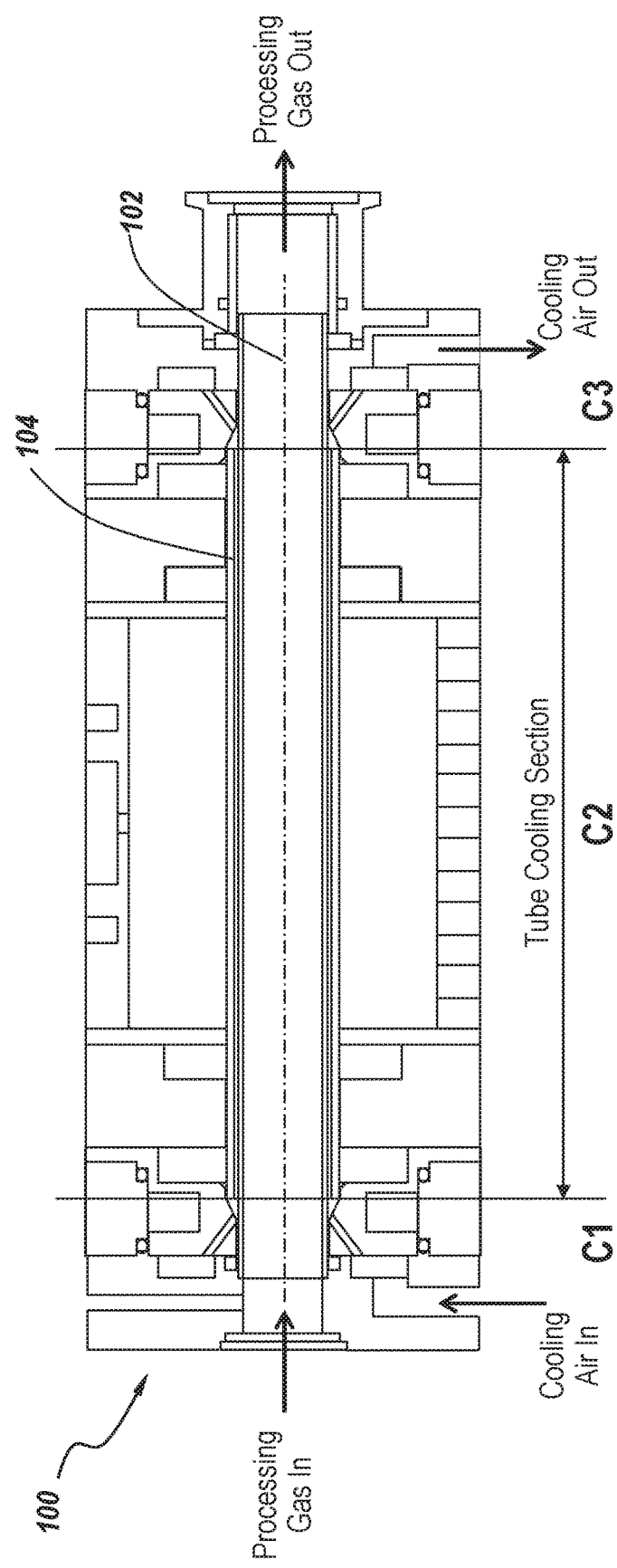
FIG. 8 is a schematic cross-sectional diagram of a plasma applicator with the optimized cooling described herein, according to exemplary embodiments.

FIG. 8 is a schematic cross-sectional diagram of plasma applicator 100 with the optimized cooling described herein, according to exemplary embodiments. Referring to FIG. 8, once the value of g is determined, the cooling can be further enhanced by increasing the flow conductance outside the tube cooling section C2. The flow conductance in each of three different sections of applicator 100, indicated as C1, C2 and C3, is generally different. The total conductance of applicator 100 can be written as $$\frac{1}{C} = \frac{1}{C_1} + \frac{1}{C_2} + \frac{1}{C_3}; \qquad (3)$$

where C is the total conductance, C1 is the conductance of the upstream section of applicator 100, C2 is the conductance of the tube cooling section, and C3 is the conductance of the downstream section of applicator 100. In exemplary embodiments, C1 and C3 are further maximized to obtain the highest total conductance and flow rate, and therefore to maximize the cooling performance in applicator 100. This includes the use of a maximum number of largest injection holes, shortest cooling air passage and largest cross-sectional area, when possible.

The cooling approach of the exemplary embodiments provides low thermal stress on plasma discharge tube 102, compared with other cooling approaches. Because of the improved cooling provided, it is not necessary that plasma discharge tube 102 have a high wall thickness as a defense against damage from high thermal stress caused by an uneven cooling surface. According to the exemplary embodiments, for a given heat flux on the inner surface of plasma discharge tube 102 and a given tube material, a thinner wall results in lower tube temperature. This allows plasma discharge tube 102 to have a relatively small wall thickness, such that further temperature reduction is realized.

Figure 9:
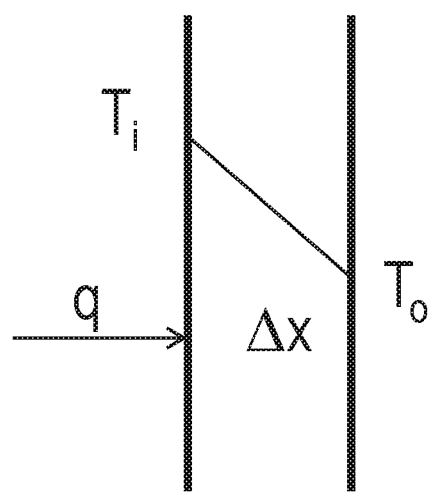
FIG. 9 is a schematic diagram illustrating the relationship between plasma discharge tube wall thickness and temperature.

FIG. 9 is a schematic diagram illustrating the relationship between plasma discharge tube 102 wall thickness and temperature. Referring to FIG. 9, $$q = k \frac{T_i - T_o}{\Delta x}; \quad (4)$$

where q is the heat flux, $T_i$ is the inner tube temperature, $T_o$ is the outer temperature, k is the thermal conductivity, and $\Delta x$ is the thickness of plasma discharge tube 102. Equation (4) can also be written as $$T_i = T_o + \frac{q \Delta x}{k}. \quad (5)$$

As shown by equations (4) and (5), a smaller wall thickness results in lower inner tube temperature.

Figure 10:
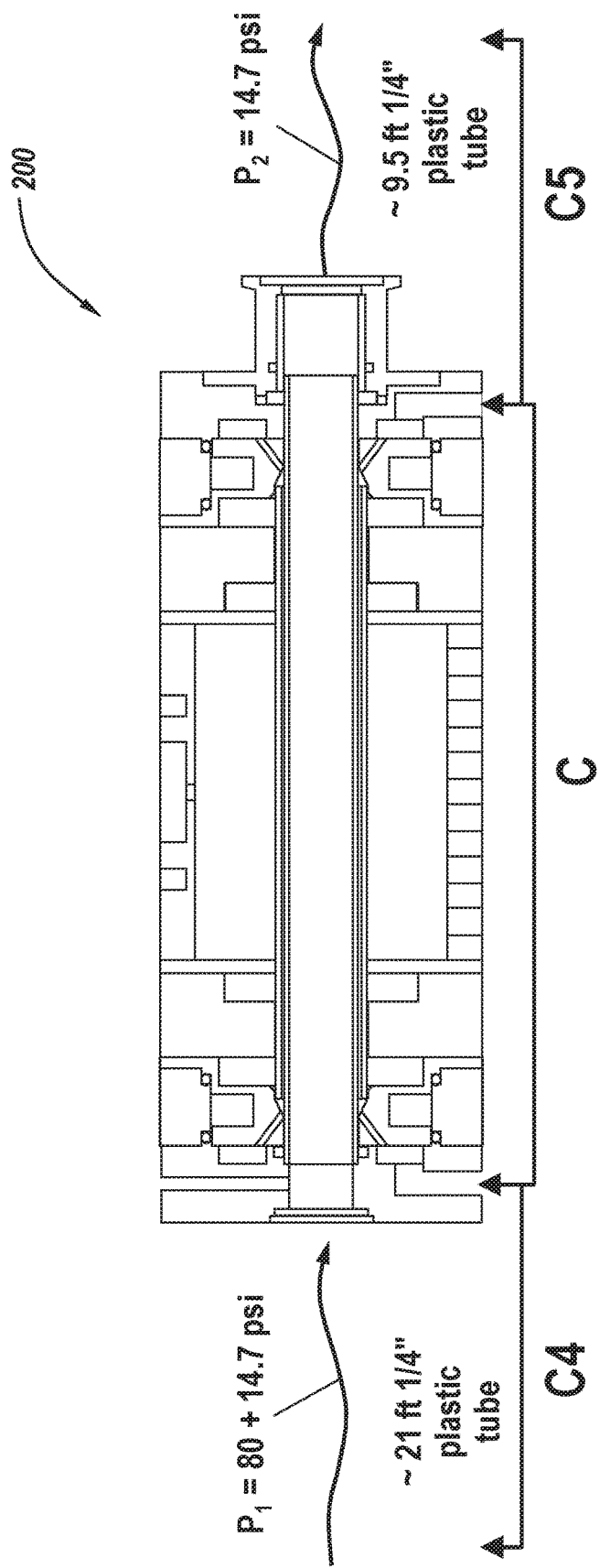
FIG. 10 is a schematic cross-sectional diagram of another plasma applicator, according to exemplary embodiments, illustrating design and test parameters used in optimizing cooling of the plasma applicator 200, according to exemplary embodiments.

FIG. 10 is a schematic cross-sectional diagram of another plasma applicator 200, according to exemplary embodiments, illustrating design and test parameters used in optimizing cooling of plasma applicator 200, according to exemplary embodiments. Referring to FIG. 10, best cooling performance in a large range of capabilities of compressed air systems was determined. Specifically, plasma applicators 100 and 200 were designed and tested using a setting as illustrated in FIG. 10, where P1 is the upstream pressure, P2 is the downstream pressure, C4 is the upstream flow conductance, and C5 the downstream flow conductance due to connection. To verify that this design is the best if the flow setting is different, a theoretical setting was used to provide the highest capability of the compressed air system, i.e., setting C4=C5=0. The flow rate was then calculated based on which the thermal performance of the current design was simulated and found to be the best in the term of the lowest temperature at plasma discharge tube 102.

To describe the optimization, from the total heat equation:

$$Q = C_p F(T_{out} - T_{in}); \quad (6)$$

where Q is the total heat removed by air per second, Cp the specific heat of air (W/kg), F is the air flow rate, $T_{out}$ is the temperature of air at the outlet, and $T_{in}$ is the temperature of air at the inlet. Q increases with an increase in F. F increases with an increase in air pressure, and for a constant pressure, a large gap between the plasma tube and jacket tube results in a higher F.

From heat transfer, $$Q = hk(T_{wall} - T_{air}); \quad (7)$$

where h is the heat transfer coefficient, k is the thermal conductivity of the air, $T_{wall}$ is the temperature of plasma discharge tube 102, and $T_{air}$ is the temperature of air. Q increases with an increase in h. H also increases with an increase of pressure, and when the pressure is constant, a narrower gap between plasma discharge tube 102 and cooling jacket 104 will result in a higher h. However, in a given compressed air system, the highest pressure is constant. Therefore, an optimized gap between plasma tube 102 and cooling jacket 104 is provided, according to the exemplary embodiments.

Two test conditions were developed, from which all values of the flow conductance in the system were developed. The air flows in all possible conditions and designs were predicted. An optimized tube gap g was generated based on a selected exemplary commercial compression air system, applicable to all pressure ranges, to provide the best cooling result for plasma discharge tube 102.

Figure 11:
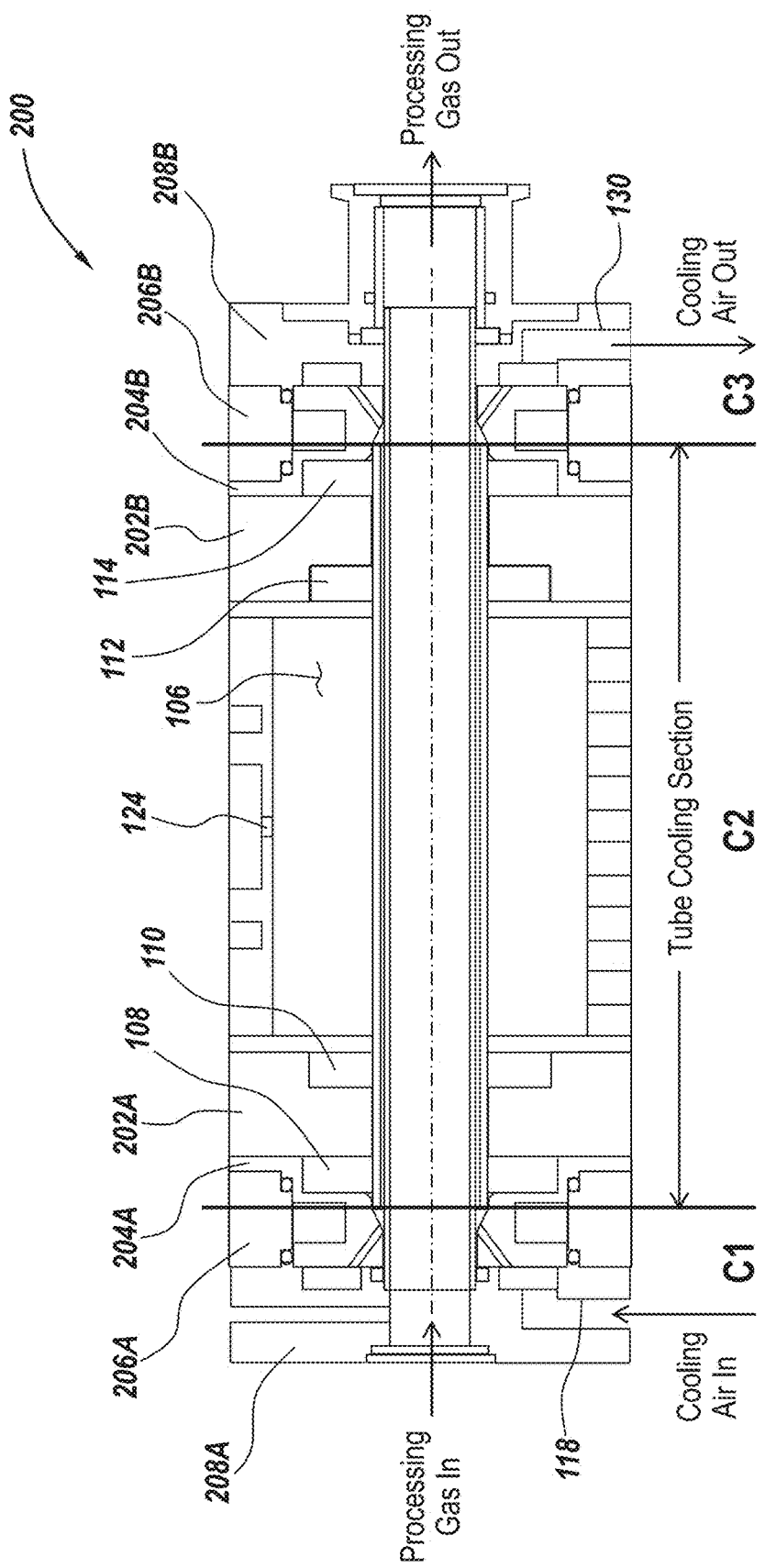
FIG. 11 is a detailed schematic cross-sectional diagram of the plasma applicator illustrated in FIG. 10, according to exemplary embodiments.

FIG. 11 is a schematic cross-sectional diagram of plasma applicator 200 illustrated in FIG. 10, according to exemplary embodiments. Referring to FIG. 11, plasma applicator 200 is similar to plasma applicator 100 described herein, with the exception of water cooling of flanges in applicator 200. Like elements in plasma applicators 100 and 200 are identified using like reference numerals.

Referring to FIG. 11, microwave cavity 106 includes radial cavity flanges 202A and 202B around the exterior of plasma discharge tube 102 and cooling jacket 104. A radial inlet flange 208A is disposed at the inlet end of plasma applicator 200 around the exterior of plasma discharge tube 102 and cooling jacket 104. A radial outlet flange 208B is disposed at the outlet inlet end of plasma applicator 200 around the exterior of plasma discharge tube 102 and cooling jacket 104.

In addition to the air cooling of plasma applicator 200 provided via cooling jacket 104, plasma applicator 200 also provides cooling of flanges 202A, 202B, 208A and 208B by a liquid such as water. To that end, plasma applicator 200 includes radial water fittings 206A and 206B through which water can pass into and out of circulating water passages 204A and 204B.

Figure 12:
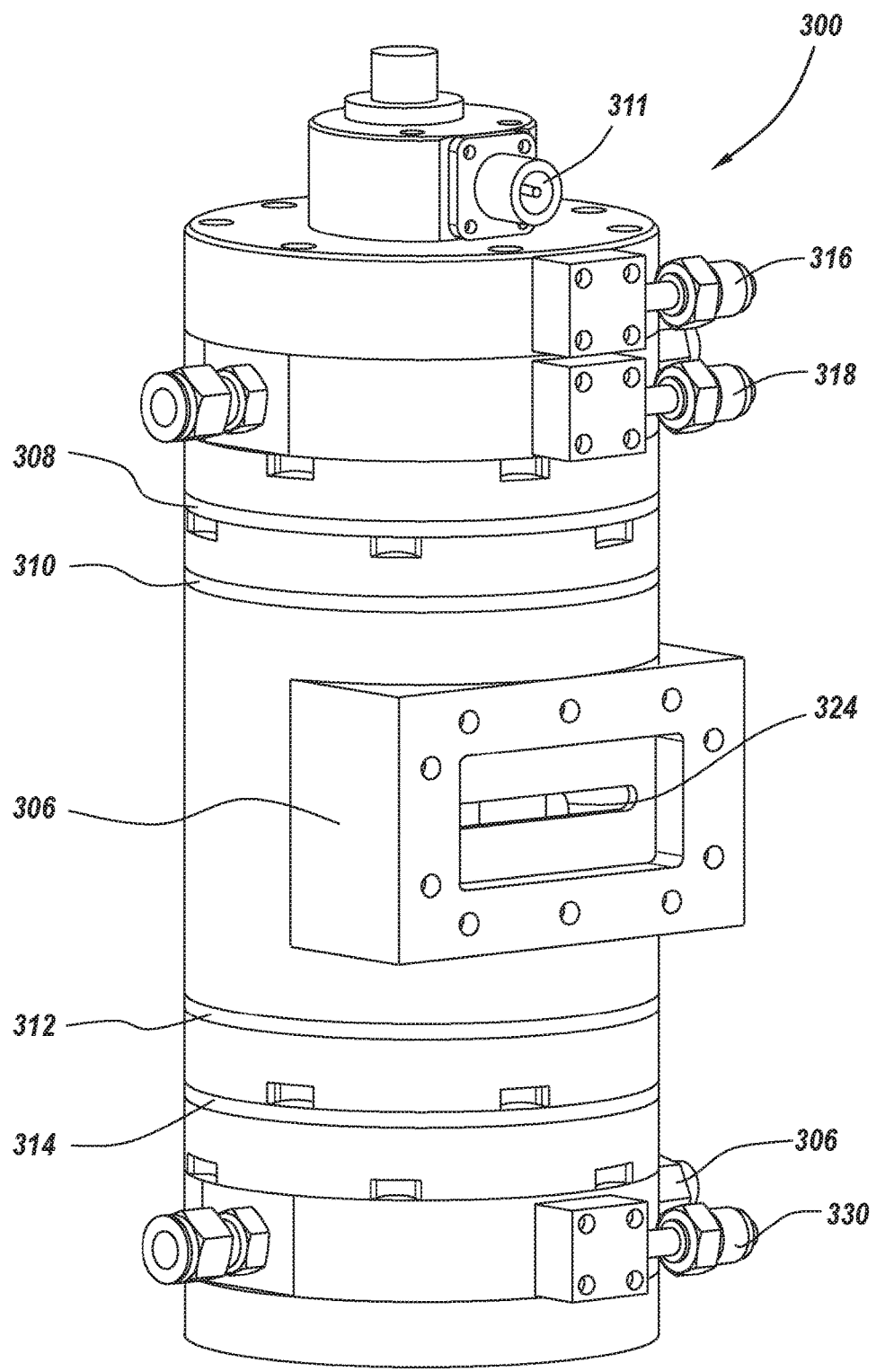
FIG. 12 includes a schematic pictorial perspective view of a substantially cylindrical plasma applicator, according to exemplary embodiments.
Figure 13:
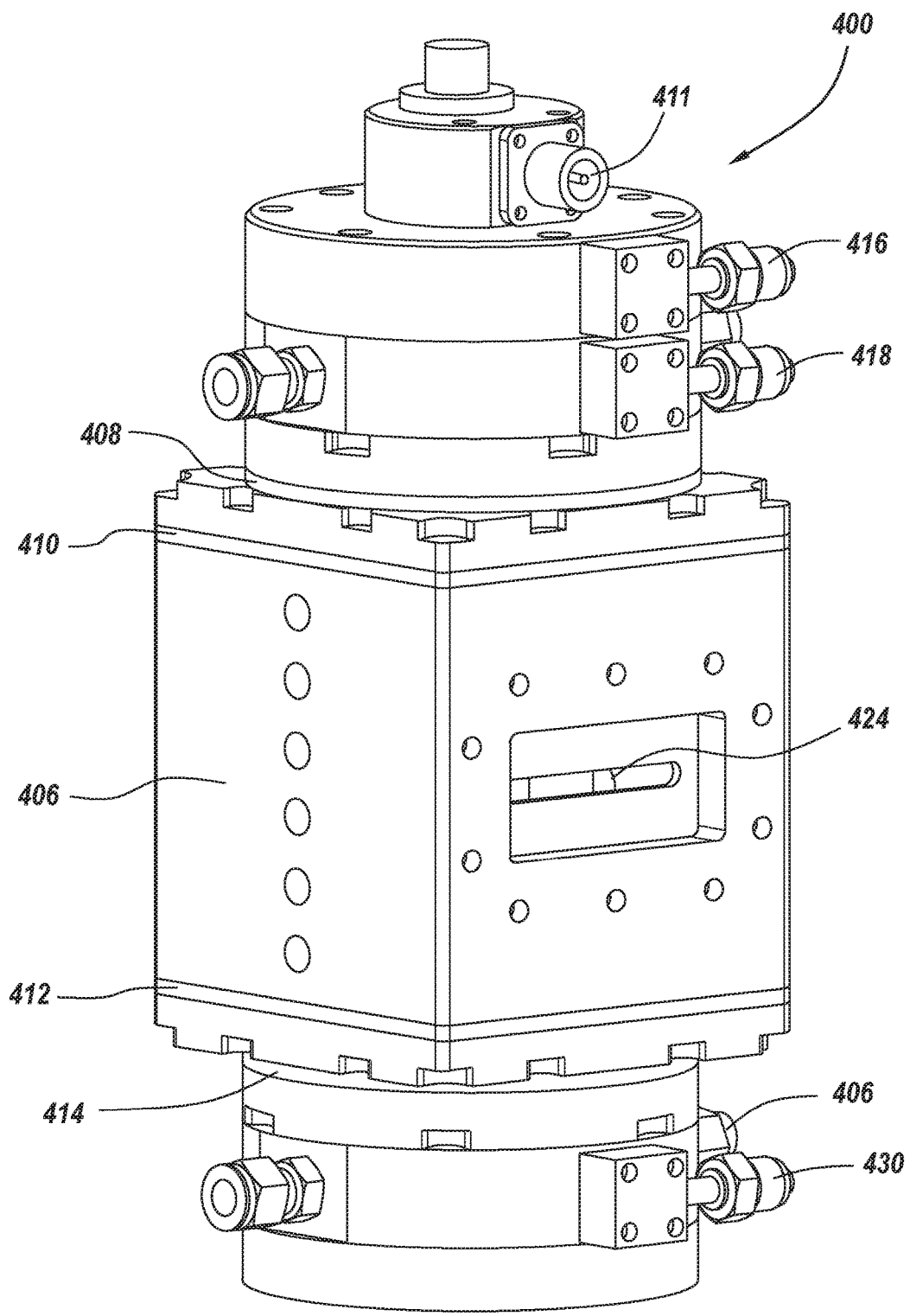
FIG. 13 includes a schematic pictorial perspective view of a substantially rectangular plasma applicator, according to exemplary embodiments.

FIGS. 12 and 13 include schematic pictorial perspective views of alternative embodiments of plasma applicators, according to exemplary embodiments. Specifically, FIG. 12 includes a schematic pictorial perspective view of a substantially cylindrical plasma applicator 300, according to exemplary embodiments, and FIG. 13 includes a schematic pictorial perspective view of a substantially rectangular plasma applicator 400, according to exemplary embodiments. The entire detailed description herein applies to the embodiments of plasma applicators 300 and 400 in FIGS. 12 and 13, respectively, unless the context dictates otherwise.

Referring to FIGS. 12 and 13, plasma applicators 300 and 400 include igniter lamp assemblies 311, 411 for initiating ignition of plasma. Plasma applicators 300, 400 include process gas inlets 316, 416, as well as air cooling inlets 318, 418 and air cooling outlets 330, 430, for providing air cooling according to the exemplary embodiments described above in detail. Plasma applicators 300, 400 also include water cooling ports 3063, 406 for providing water cooling of flanges according to the exemplary embodiments described above in detail. Plasma applicators 300, 400 also include coupling irises 324, 424 at which a waveguide can be mounted to couple microwave energy into microwave cavities 306, 406 for generation of plasma. Plasma applicators 300, 400 also include microwave chokes or traps 308, 310, 312, 314 and 408, 410, 412, 414, as described above in detail, according to exemplary embodiments.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

The invention claimed is:

1. A plasma applicator, comprising:
a plasma discharge tube in which plasma can be generated, the plasma discharge tube having a process gas inlet for allowing a plasma process gas to enter the plasma discharge tube, the plasma discharge tube having a longitudinal axis;
a microwave cavity at least partially surrounding a portion of the plasma discharge tube; and
a coupling iris at which microwave energy can be coupled to the microwave cavity such that the microwave energy can generate a plasma in the portion of the plasma discharge tube; wherein
primary electric fields generated from the microwave energy combine with an evanescent electric field generated from the coupling iris, such that a combined electric field in the microwave cavity is substantially uniform along the longitudinal axis of the plasma discharge tube.

2. The plasma applicator of claim 1, wherein the microwave cavity has three orthogonal dimensions including a length, a width and a height, at least two of the orthogonal dimensions being selected such that the microwave energy in the microwave cavity propagates in a transverse electric (TE) mode.

3. The plasma applicator of claim 1, further comprising a plurality of radial microwave chokes disposed over an exterior of the plasma discharge tube and disposed at ends of the microwave cavity for substantially containing the microwave energy in the microwave cavity, positions of the microwave chokes being such that microwave energy propagating in the TE mode and the transverse electric magnetic (TEM) mode is attenuated.

4. The plasma applicator of claim 3, wherein the plurality of radial microwave chokes comprise a first inner choke and a first outer choke located at a first end of the microwave cavity and a second inner choke and a second outer choke located at a second end of the microwave cavity, a first space between the first inner choke and the first outer choke and a second space between the second inner choke and the second outer choke being selected to provide attenuation of the microwave energy propagating in the TE mode and the TEM mode.

5. The plasma applicator of claim 4, wherein at least one of the first and second spaces is approximately 0.38 inch.

6. The plasma applicator of claim 4, wherein the first and second spaces are substantially equal.

7. The plasma applicator of claim 1, wherein the microwave energy has a power of approximately 1 kW.

8. The plasma applicator of claim 1, wherein a source of the microwave energy comprises a solid state generator.

9. The plasma applicator of claim 1, wherein a source of the microwave energy comprises a magnetron.

10. The plasma applicator of claim 1, wherein the plasma discharge tube is made of a material including at least one of quartz, sapphire, ceramic, aluminum nitride and boron nitride.

11. The plasma applicator of claim 1, wherein the process gas comprises at least one of oxygen, nitrogen, hydrogen, fluorinated gas, forming gas, $NF_3$, $NH_3$, $C_2F_4$, and $C_2F_6$.

12. A plasma applicator, comprising:
a plasma discharge tube in which plasma can be generated, the plasma discharge tube having a process gas inlet for allowing a plasma process gas to enter the plasma discharge tube, the plasma discharge tube having a longitudinal axis;
a microwave cavity at least partially surrounding a portion of the plasma discharge tube;
a coupling iris at which microwave energy can be coupled to the microwave cavity such that the microwave energy can generate a plasma in the portion of the plasma discharge tube; and
a plurality of radial microwave chokes disposed over an exterior of the plasma discharge tube and disposed at ends of the microwave cavity for substantially containing the microwave energy in the microwave cavity, positions of the microwave chokes being such that microwave energy propagating in a transverse electric (TE) mode and a transverse electric magnetic (TEM) mode is attenuated.

13. The plasma applicator of claim 12, wherein the plurality of radial microwave chokes comprise a first inner choke and a first outer choke located at a first end of the microwave cavity and a second inner choke and a second outer choke located at a second end of the microwave cavity, a first space between the first inner choke and the first outer choke and a second space between the second inner choke and the second outer choke being selected to provide attenuation of the microwave energy propagating in the TE mode and the TEM mode.

14. The plasma applicator of claim 13, wherein at least one of the first and second spaces is approximately 0.38 inch.

15. The plasma applicator of claim 13, wherein the first and second spaces are substantially equal.

16. The plasma applicator of claim 12, wherein the microwave cavity has three orthogonal dimensions including a length, a width and a height, at least two of the orthogonal dimensions being selected such that the microwave energy in the microwave cavity propagates in a transverse electric (TE) mode.

17. The plasma applicator of claim 12, wherein primary electric fields generated from the microwave energy combine with an evanescent electric field generated from the coupling iris, such that a combined electric field in the microwave cavity is substantially uniform along the longitudinal axis of the plasma discharge tube.

18. The plasma applicator of claim 12, wherein the microwave energy has a power of approximately 1 kW.

19. The plasma applicator of claim 12, wherein a source of the microwave energy comprises a solid state generator.

20. The plasma applicator of claim 12, wherein a source of the microwave energy comprises a magnetron.

21. The plasma applicator of claim 12, wherein the plasma discharge tube is made of a material including at least one of quartz, sapphire, ceramic, aluminum nitride and boron nitride.

22. The plasma applicator of claim 12, wherein the process gas comprises at least one of oxygen, nitrogen, hydrogen, fluorinated gas, forming gas, $NF_3$, $NH_3$, $C_2F_4$, and $C_2F_6$.

* * * * *